US012713811B2

(12) United States Patent
Pyo et al.

(10) Patent No.: US 12,713,811 B2
(45) Date of Patent: Aug. 18, 2026

(54) DISPLAY DEVICE

(71) Applicant: LG ELECTRONICS INC., Seoul (KR)

(72) Inventors: Jonggil Pyo, Seoul (KR); Chulki Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 424 days.

(21) Appl. No.: 18/279,677

(22) PCT Filed: Sep. 29, 2021

(86) PCT No.: PCT/KR2021/013364
§ 371 (c)(1),
(2) Date: Aug. 31, 2023

(87) PCT Pub. No.: WO2023/054745
PCT Pub. Date: Apr. 6, 2023

(65) Prior Publication Data

US 2024/0147813 A1 May 2, 2024

(51) Int. Cl.
*H10K 59/80* (2023.01)
*H10K 102/00* (2023.01)

(52) U.S. Cl.
CPC ..... *H10K 59/872* (2023.02); *H10K 2102/311* (2023.02)

(58) Field of Classification Search
CPC ........... H10K 59/872; H10K 2102/311; H10K 59/87; H10K 77/111; G06F 1/1601; G06F 1/1652; G09F 9/301; F16H 1/16; F16H 1/30
See application file for complete search history.

(56) References Cited

U.S. PATENT DOCUMENTS

| | | | | |
|---|---|---|---|---|
| 10,290,240 B2 * | 5/2019 | Kang | ........................ | G09G 3/20 |
| 2014/0376163 A1 * | 12/2014 | Song | ........................ | G09F 9/301 |
| | | | | 361/679.01 |
| 2017/0347466 A1 | 11/2017 | Kang et al. | | |

FOREIGN PATENT DOCUMENTS

| | | |
|---|---|---|
| EP | 2816440 | 12/2014 |
| JP | 202133192 | 3/2021 |
| KR | 1020160050689 | 5/2016 |

(Continued)

OTHER PUBLICATIONS

European Patent Office Application Serial No. 21959516.2, Search Report dated Sep. 6, 2024, 9 pages.

(Continued)

*Primary Examiner* — Joe E. Schoenholtz
(74) *Attorney, Agent, or Firm* — LEE, HONG, DEGERMAN, KANG & WAIMEY

(57) ABSTRACT

Disclosed is a display device. The display device may include a flexible display panel; a flexible plate which is positioned in a rear side of the display panel, and coupled to the display panel; a driving module which is coupled to a rear side of the plate, and has a slider that linearly reciprocates; a wing which extends long, has one end coupled to the slider, has the other end coupled to the rear side of the plate, and has a pivot shaft positioned, between the one end and the other end, to be adjacent to the one end; and a wing bracket which is adjacent to the pivot shaft and fixed to the rear side of the plate, and coupled to the pivot shaft.

14 Claims, 16 Drawing Sheets

(56) References Cited

FOREIGN PATENT DOCUMENTS

| | | |
|---|---|---|
| KR | 1020160145907 | 12/2016 |
| KR | 1020170005946 | 1/2017 |
| KR | 101720178 | 3/2017 |
| KR | 101749713 | 7/2017 |

OTHER PUBLICATIONS

PCT International Application No. PCT/KR2021/013364, International Search Report dated Jun. 17, 2022, 4 pages.

* cited by examiner

DISPLAY DEVICE

CROSS-REFERENCE TO RELATED APPLICATIONS

This application is the National Stage filing under 35 U.S.C. 371 of International Application No. PCT/KR2021/013364, filed on Sep. 29, 2021, the contents of which are all incorporated by reference herein in their entirety.

TECHNICAL FIELD

The present disclosure relates to a display device. More specifically, the present disclosure relates to a display device capable of changing the curvature of a display panel.

BACKGROUND ART

As information society develops, the demand for display devices is also increasing in various forms. In response to this, various display devices such as Liquid Crystal Display Device (LCD), Electroluminescent Display (ELD), Vacuum Fluorescent Display (VFD), and Organic Light Emitting Diode (OLED) have been researched and used in recent years.

Among them, an OLED panel can display an image by depositing an organic material layer capable of emitting light by itself on a substrate in which a transparent electrode is formed. The OLED panel may have a thin thickness as well as flexible characteristics. A lot of research has been accomplished on the structural characteristics of a display device having such an OLED panel.

DISCLOSURE

Technical Problem

An object of the present disclosure is to solve the above and other problems. Another object may be to provide a structure that can freely change the curvature of a display panel.

Another object may be to provide a mechanism that can freely change the curvature of a display.

Technical Solution

According to an aspect of the present disclosure to achieve the above or other objects, the display device may include a flexible display panel; a flexible plate which is positioned in a rear side of the display panel, and coupled to the display panel; a driving module which is coupled to a rear side of the plate, and has a slider that linearly reciprocates; a wing which extends long, has one end coupled to the slider, has the other end coupled to the rear side of the plate, and has a pivot shaft positioned, between the one end and the other end, to be adjacent to the one end; and a wing bracket which is adjacent to the pivot shaft and fixed to the rear side of the plate, and coupled to the pivot shaft.

Advantageous Effects

According to at least one embodiment of the present disclosure, it is possible to provide a structure that can freely change the curvature of a display panel.

According to at least one embodiment of the present disclosure, it is possible to provide a mechanism that can freely change the curvature of a display.

Further scope of applicability of the present disclosure will become apparent from the following detailed description. However, it should be understood that the detailed description and specific embodiments such as preferred embodiments of the present disclosure are given by way of illustration only, since various changes and modifications within the spirit and scope of the present disclosure may be clearly understood by those skilled in the art.

MODE FOR INVENTION

Figure 1:
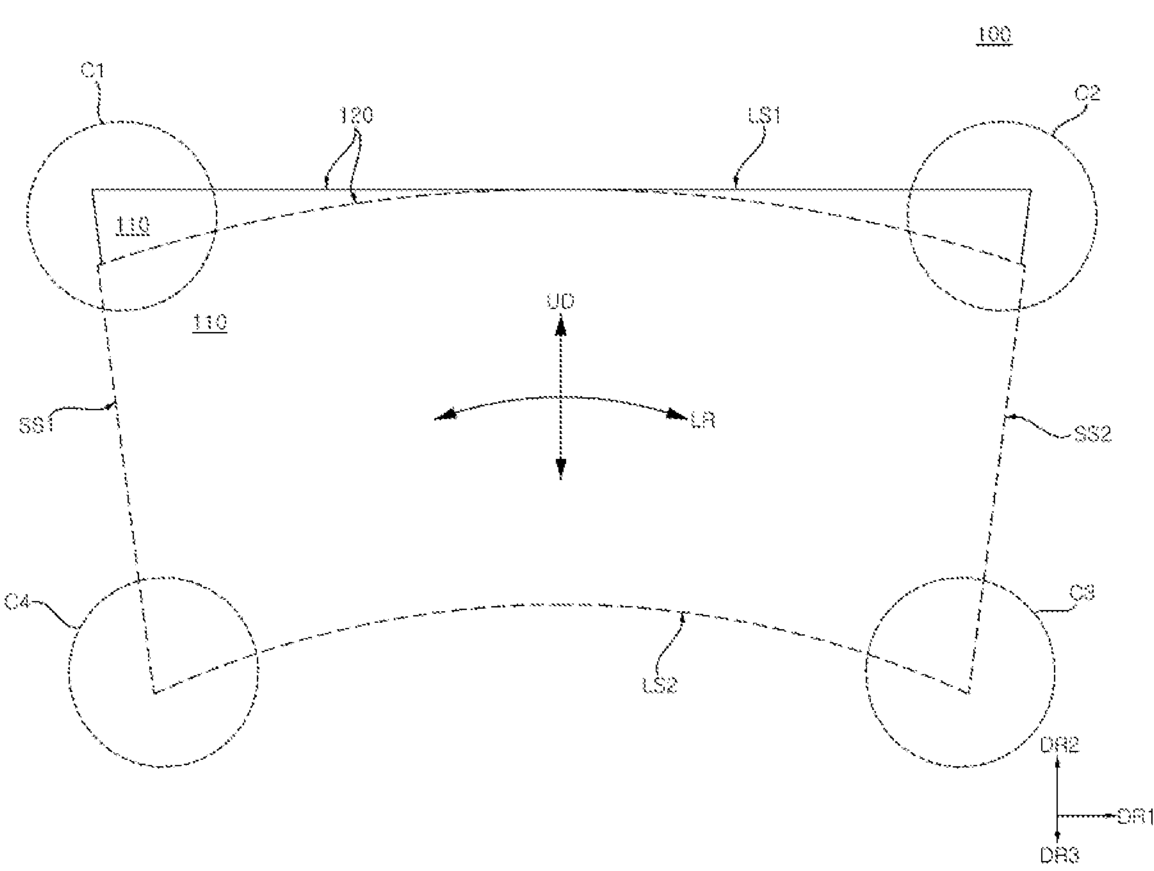
FIGS. 1 to 16 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function. In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Hereinafter, an organic light emitting diode (OLED) will be described as an example for a display panel, but the display panel applicable to the present disclosure is not limited to the OLED panel.

In addition, hereinafter, the display device may include a first long side LS1, a second long side LS2 opposite the first long side LS1, a first short side SS1 adjacent to one end of the first long side LS1 and the second long side LS2, and a second Short Side SS2 opposite to the first short side SS1.

Here, the first short side area SS1 may be referred to as a first side area, the second short side area SS2 may be referred to as a second side area opposite to the first side area, the first long side area LS1 may be referred to as a third side area which is adjacent to the first side area and the second side area, and located between the first side area and the second side area, and the second long side area LS2 may be referred to as a fourth side area which is adjacent to the first side area and the second side area, located between the first side area and the second side area, and opposite to the third side area.

In addition, for convenience of explanation, the lengths of the first and second long sides LS1 and LS2 are illustrated and described as being longer than the lengths of the first and second short sides SS1 and SS2, but a case in which the lengths of the first and second long sides LS1 and LS2 are approximately equal to the lengths of the first and second short sides SS1 and SS2 may also be possible.

In addition, in the following, a first direction DR1 may be a direction parallel to the long side LS1, LS2 of the display device, and a second direction DR2 may be a direction parallel to the short side SS1, SS2 of the display device. A third direction DR3 may be a direction perpendicular to the first direction DR1 and/or the second direction DR2.

The first direction DR1 and the second direction DR2 may be collectively referred to as a horizontal direction. In addition, the third direction DR3 may be referred to as a vertical direction.

A side on which the display device displays an image may be referred to as a front side or a front surface. When the display device displays an image, the side from which the image cannot be observed may be referred to as a rear side or a rear surface. When the display is viewed from the front side or the front surface, the side of the first long side LS1 may be referred to as an upper side or an upper surface. Similarly, the side of the second long side LS2 may be referred to as a lower side or a lower surface. Similarly, the side of the first short side SS1 may be referred to as a left side or a left surface, and the side of the second short side SS2 may be referred to as a right side or a right surface.

Further, the first long side LS1, the second long side LS2, the first short side SS1, and the second short side SS2 may be referred to as an edge of the display device. In addition, a point where the first long side LS1, the second long side LS2, the first short side SS1, and the second short side SS2 meet each other may be referred to as a corner. For example, a point where the first long side LS1 and the first short side SS1 meet may be a first corner C1, a point where the first long side LS1 and the second short side SS2 meet may be a second corner C2, a point where the second short side SS2 and the second long side LS2 meet may be a third corner C3, and a point where the second long side LS2 and the first short side SS1 meet may be a fourth corner C4.

Here, a direction from the first short side SS1 toward the second short side SS2 or a direction from the second short side SS2 toward the first short side SS1 may be referred to as a left-right direction LR. A direction from the first long side LS1 toward the second long side LS2 or a direction from the second long side LS2 toward the first long side LS1 may be referred to as an up-down direction UD.

Referring to FIG. 1, a plate 120 may be flexible. For example, the plate 120 may be a metal plate. The plate 120 may be referred to as a flexible plate 120, a frame 120, or a module cover 120. A display panel 110 may be located in the front side or in the front surface of the plate 120. The display panel 110 may be flexible. For example, the display panel 110 may be an OLED panel.

The display panel 110 may be provided on the front surface of the display device 100 and display an image. The display panel 110 may divide an image into a plurality of pixels and output an image by matching color, brightness, and saturation for each pixel. The display panel 110 may generate light corresponding to a color of red, green, or blue according to a control signal.

The display device 100 may have a variable curvature. In the display device 100, left and right sides of the display device 100 may move to the front side. For example, in a state where an image is viewed from the front side of the display device 100, the display device 100 may be curved concavely. In this case, the plate 120 may be bent with the same curvature as the display panel 110. Alternatively, the display panel 110 may be bent to correspond to the curvature of the plate 120.

Figure 2:
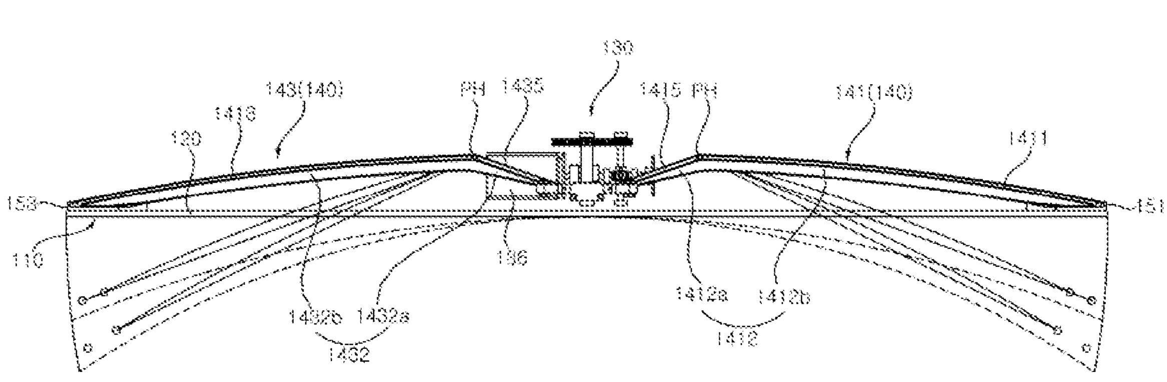
Figure 3:
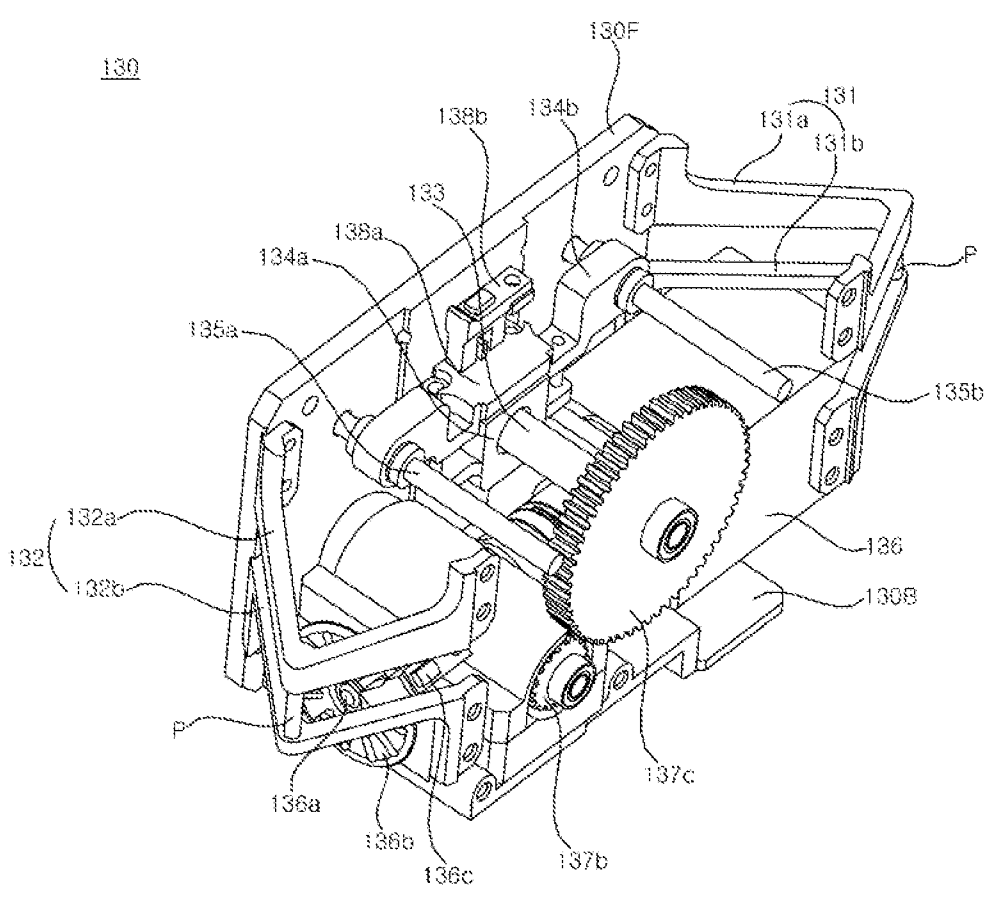

Referring to FIGS. 2 and 3, the plate 120 may be coupled to the rear side of the display panel 110. The plate 120 may support the rear side of the display panel 110. The plate 120 may have a shape corresponding to the display panel 110.

A driving module 130 may be coupled to the rear side of the plate 120. The driving module 130 may include a front bracket 130F, a base 130B, and wing brackets 131 and 132.

The front bracket 130F may be coupled to or fixed to the rear side or rear surface of the plate 120. The front bracket 130F may have a flat plate shape having a rectangular shape. The base 130B may be coupled to or fixed to the front bracket 130F, and may form the bottom of the driving module 130.

The wing bracket 131, 132 may be plural. The plurality of wing brackets 131 and 132 may include a first wing bracket 131 and a second wing bracket 132. The first wing bracket 131 may be coupled or fixed to the front bracket 130F, and may face the second wing bracket 132. The second wing bracket 132 may also be coupled or fixed to the front bracket 130F.

The wing bracket 131, 132 may have a V-shape. The wing bracket 131, 132 may be a pair of brackets 131 and 132. In the wing bracket 131, 132, an upper bracket 131*a*, 132*a* and a lower bracket 131*b*, 132*b* may be positioned side by side. A pin P may be positioned between the upper bracket 131*a*, 132*a* and the lower bracket 131*b*, 132*b*. The vertices of the upper bracket 131*a*, 132*a* and the lower bracket 131*b*, 132*b* may be connected.

A first wing 143 may be rotatably coupled to the first wing bracket 131, and a second wing 141 may be rotatably coupled to the second wing bracket 132. The first wing 143 may be line-symmetric with the second wing 141 with respect to the driving unit 130.

Figure 4:
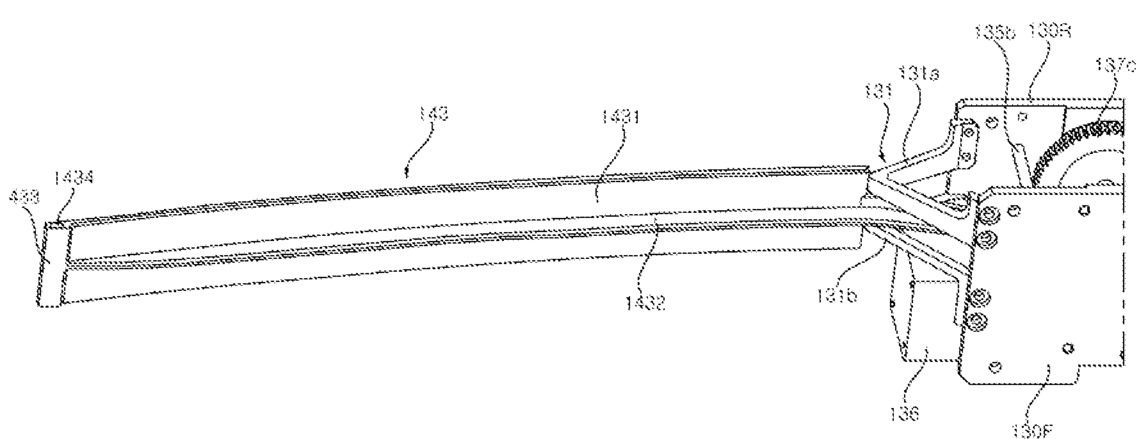
Figure 5:
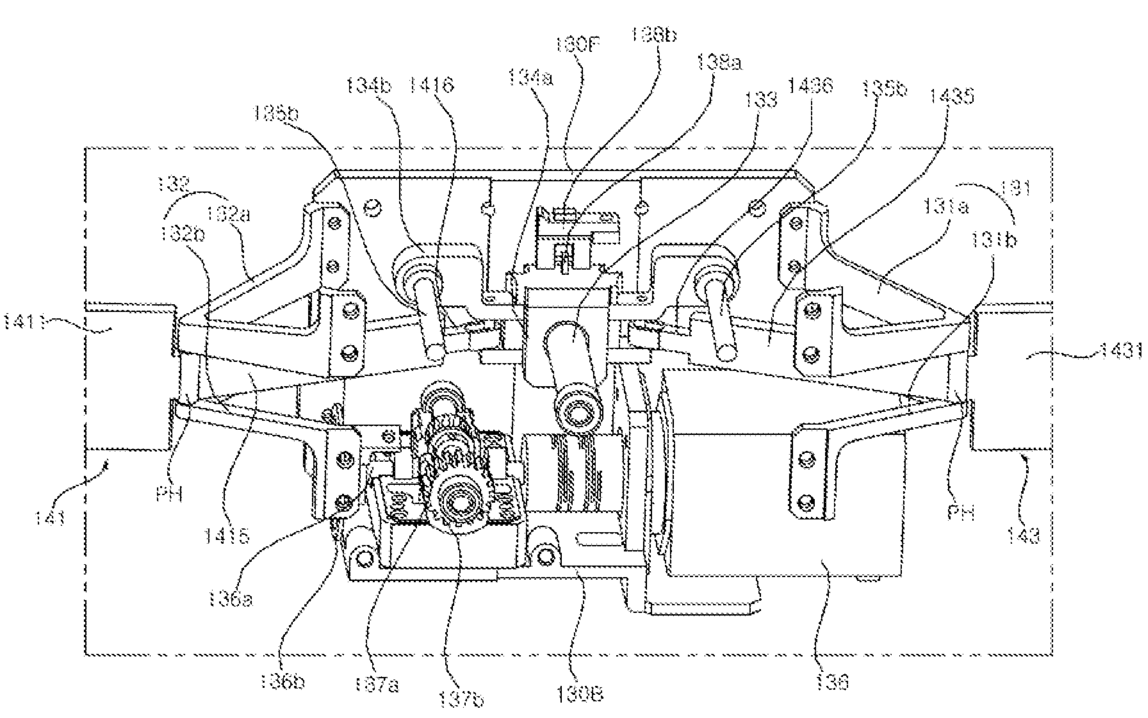

Referring to FIGS. 4 and 5, the first wing 143 may be pivotally connected to the first wing bracket 131. The description of the first wing 143 and the first wing bracket 131 may be applied to the second wing 141 and the second wing bracket 132. The first wing 143 may include a wing plate 1431, a rib 1432, a wing end 1433, a pivot shaft PH, and a lever 1435.

The wing plate 1431 may be an elongated plate. The lever 1435 may extend from one end of the wing plate 1431. The lever 1435 may be an elongated plate. The length of the lever 1435 may be smaller than the length of the wing plate 1431, and the width of the lever 1435 may be smaller than the width of the wing plate 1431. The thickness of the wing plate 1431 may be substantially the same as the thickness of the lever 1435.

Referring to FIG. 2 together, the rib 1412, 1432 may extend long in the length direction of the wing plate 1411, 1431 and the lever 1415, 1435 and may be formed on one surface of the wing plate 1411, 1431 and the lever 1415, 1435. The rib 1412, 1432 may intersect the width direction of the wing plate 1411, 1431 and the lever 1415, 1435. The wing plate 1411, 1431 may be gently curved, and the lever 1415, 1435 may be connected to the wing plate 1411, 1431 while being bent. The rib 1412, 1432 may include a first rib 1412*a*, 1432*a* and a second rib 1412*b*, 1432*b*. The width of the first rib 1412*a*, 1432*a* may gradually become narrower as it moves away from the pivot shaft PH. The width of the second rib 1412*b*, 1432*b* may be substantially the same as the width of the first rib 1412*a*, 1432*a* adjacent to the pivot shaft PH.

In FIG. 5, the pivot shaft PH of the wing 141, 143 may be pivotally connected to the pin P of the wing bracket 131, 132. The pin P may be inserted into the pivot shaft PH of the wing 141, 143. The wing 141, 143 may rotate or pivot on the wing bracket 131, 132 about the pin P. The thickness of the pivot shaft PH may be greater than the thickness of the wing plate 1411, 1431 and/or the lever 1415, 1435. Accordingly, the structural rigidity of the wing 140 according to the driving may be improved.

Figure 6:
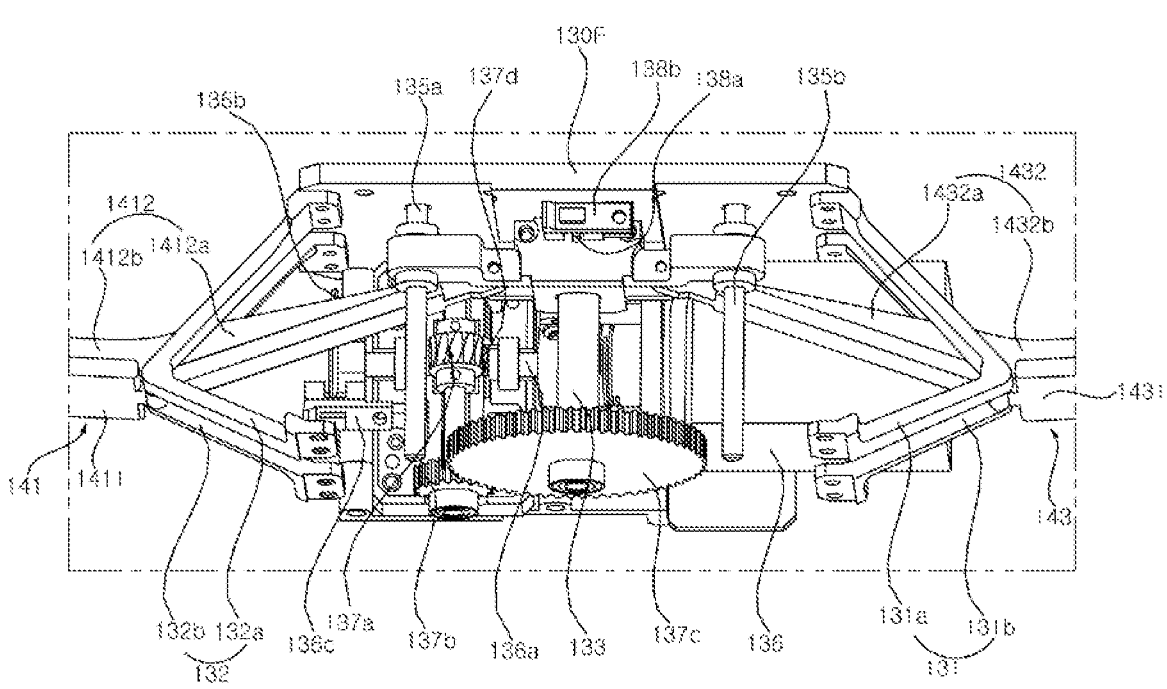

Referring to FIGS. 5 and 6, a lead screw 133 may be rotatably installed on the front bracket 130F. For example, the lead screw 133 may be elongated and may have a thread on its outer surface. The lead screw 133 may be inserted into a slider 134*a*. The slider 134*a* may be thread-coupled to the lead screw 133. When the lead screw 133 rotates, the slider 134*a* may reciprocate in the length direction of the lead screw 133.

A slider guide 134*b* may be fixed on the slider 134*a*. The slider guide 134*b* may move together with the slider 134*a*. A guide shaft 135*a*, 135*b* may be coupled or fixed to the front bracket 130F. The guide shaft 135*a*, 135*b* may be parallel to the lead screw 134*b*. The guide shaft 135*a*, 135*b* may include a first guide shaft 135*a* and a second guide shaft 135*b*. The first guide shaft 135*a* may face the second guide shaft 135*b* with respect to the lead screw 133. The guide shaft 135*a*, 135*b* may be inserted into the slider guide 134*b*. Accordingly, the slider 134*a* may stably reciprocate in the length direction of the lead screw 133 according to the rotation of the lead screw 133.

A motor 136 may be mounted on a base 130B. A rotating shaft 136*a* of the motor 136 may intersect the length direction of the lead screw 133. The motor 136 and the rotating shaft 136*a* of the motor 136 may be disposed between the lead screw 133 and the base 130B. A worm 137*d* may be fixed to the rotating shaft 136*a* of the motor 136, and may rotate together with the rotating shaft 136*a* of the motor 136. A worm gear 137*a* may be engaged with the worm 137*d*. A transmission gear 137*b* may rotate coaxially with the worm gear 137*a*. A driving gear 137*c* may be fixed to one end of the lead screw 133 and rotate together with the lead screw 133. The driving gear 137*c* may be engaged with the transmission gear 137*b*. The diameter of the driving gear 137*c* may be larger than the diameter of the transmission gear 137*b*.

A disk indicator 136*b* may be adjacent and fixed to a distal end of the rotating shaft 136*a* of the motor 136. A sensor 136*c* may be fixed to the base 130B or the wing bracket 132 while being adjacent to the disk indicator 136*b*. Accordingly, the number of rotations and/or the amount of rotation of the motor 136 may be detected. A pin indicator 138*a* may be fixed on the slider 134*a* or a slider guide 134*b*. The sensor 138*b* may be fixed to the front bracket 130F, and may detect the approach of the pin indicator 138*a*. Accordingly, a start point and/or a terminal point of the slider 134*a* may be detected.

Figure 7:
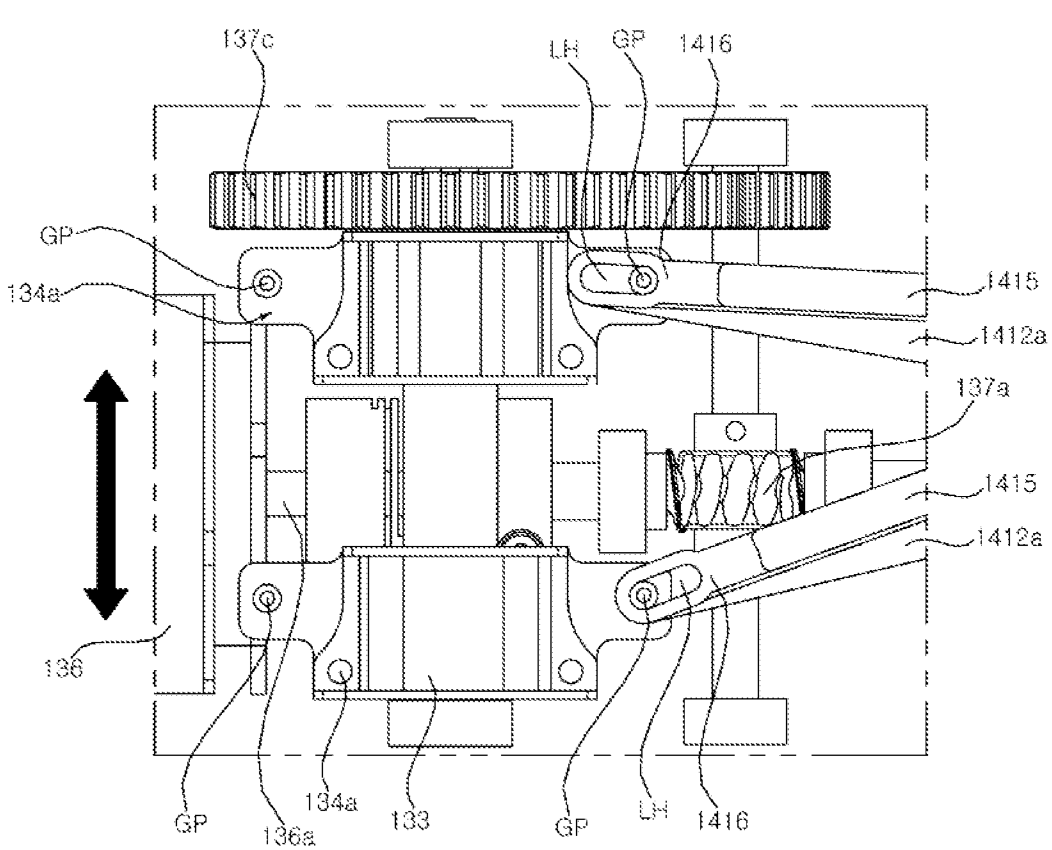
Figure 8:
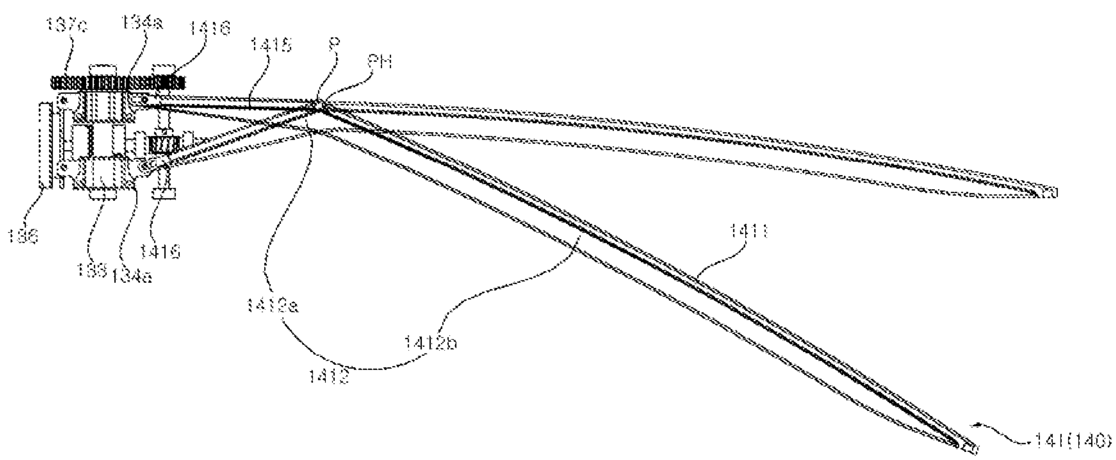

Referring to FIGS. 7 and 8, the wing 141 may include a connecting rod 1416. The connecting rod 1416 may be fixed to or extend from the lever 1415. The connecting rod 1416 may be connected to the slider 134*a*. The connecting rod 1416 may be pivotally connected to the slider 134*a*. The connecting rod 1416 may have a long hole LH. The long hole LH may be formed at a distal end of the connecting rod 1416 adjacent to the slider 134*a*. The slider 134*a* may have a connection pin GP. The connection pin GP may have a cylindrical shape. The diameter of the connection pin GP may be substantially the same as the width of the long hole LH.

As the lead screw 133 rotates, the slider 134*a* may reciprocate in the length direction of the lead screw 133. The lever 1415 connected to the slider 134*a* by the connecting rod 1416 may move together with the slider 134*a*, and the wing 141 may pivot about the pivot shaft PH. At this time, the connection pin GP may move inside the long hole LH.

Figure 9:
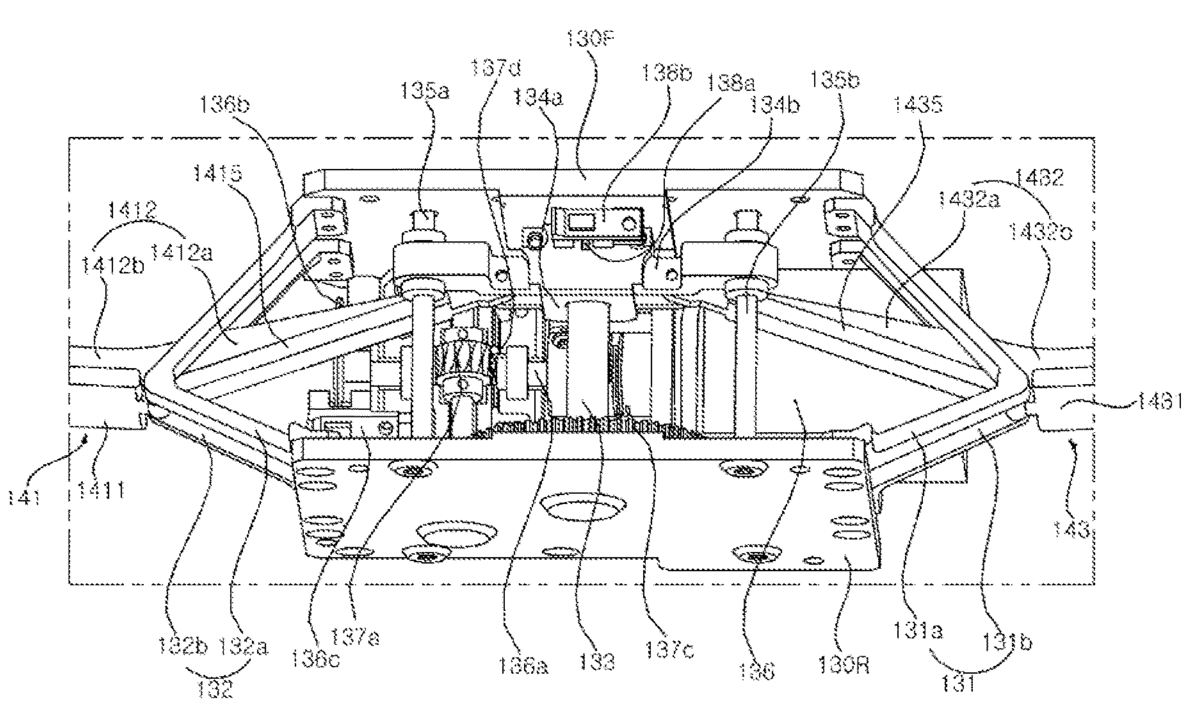

Referring to FIG. 9, a rear bracket 130R may be coupled to the wing brackets 131 and 132. The rear bracket 130R may face the front bracket 130F. The lead screw 133 may connect the front bracket 130F and the rear bracket 130R.

The guide shaft 135*a*, 135*b* may be coupled to the front bracket 130F and the rear bracket 130R. The length of the lead screw 133 and/or the length of the guide shaft 135*a*, 135*b* may correspond to a distance between the front bracket 130F and the rear bracket 130R.

The wing bracket 131, 132 may be coupled to the front bracket 130F and the rear bracket 130R. One end of the wing bracket 131, 132 may be coupled or fixed to the front bracket 130F, and the other ends of the wing bracket 131, 132 may be coupled or fixed to the rear bracket 130R.

Figure 10:
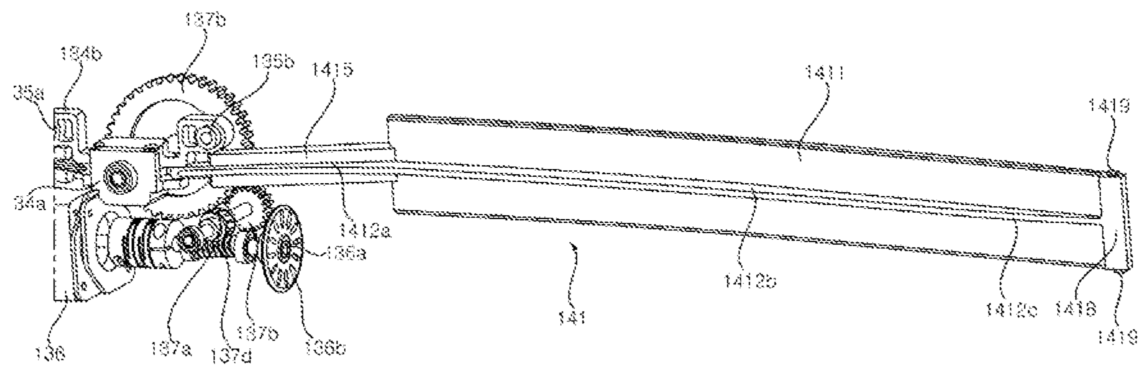
Figure 11:
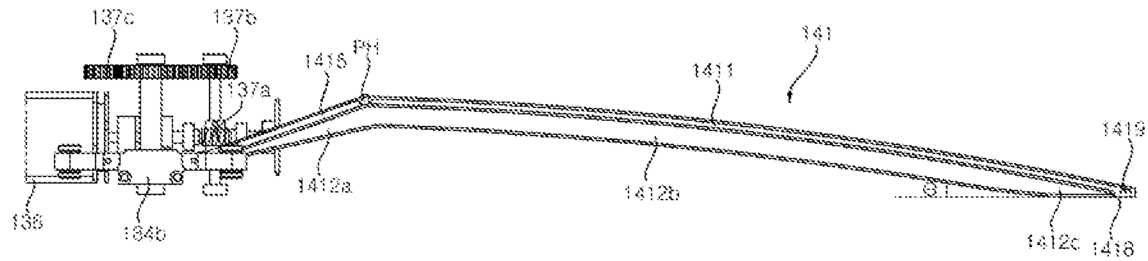

Referring to FIGS. 10 and 11, the wing 141 may include a wing end 1418 and an end rib 1412*c*. The wing end 1418 may form a distal end of the wing plate 1411. The thickness of the wing end 1418 may be greater than the thickness of the wing plate 1411.

The end rib 1412*c* may be referred to as a third rib 1412*c*. The third rib 1412*c* may connect the wing end 1418 from the second rib 1412*b*. The third rib 1412*c* may extend in the length direction of the second rib 1412*b* and may be formed in the wing plate 1411.

The length direction of the third rib 1412*c* may form a certain angle with respect to the length direction of the second rib 1412*b*. For example, the length direction of the second rib 1412*b* may form an obtuse angle with respect to the length direction of the third rib 1412*c*.

An end pin 1419 may be formed in the wing end 1418. The end pin 1419 may be formed to protrude from one end surface and/or the other end surface of the wing end 1418.

Figure 12:
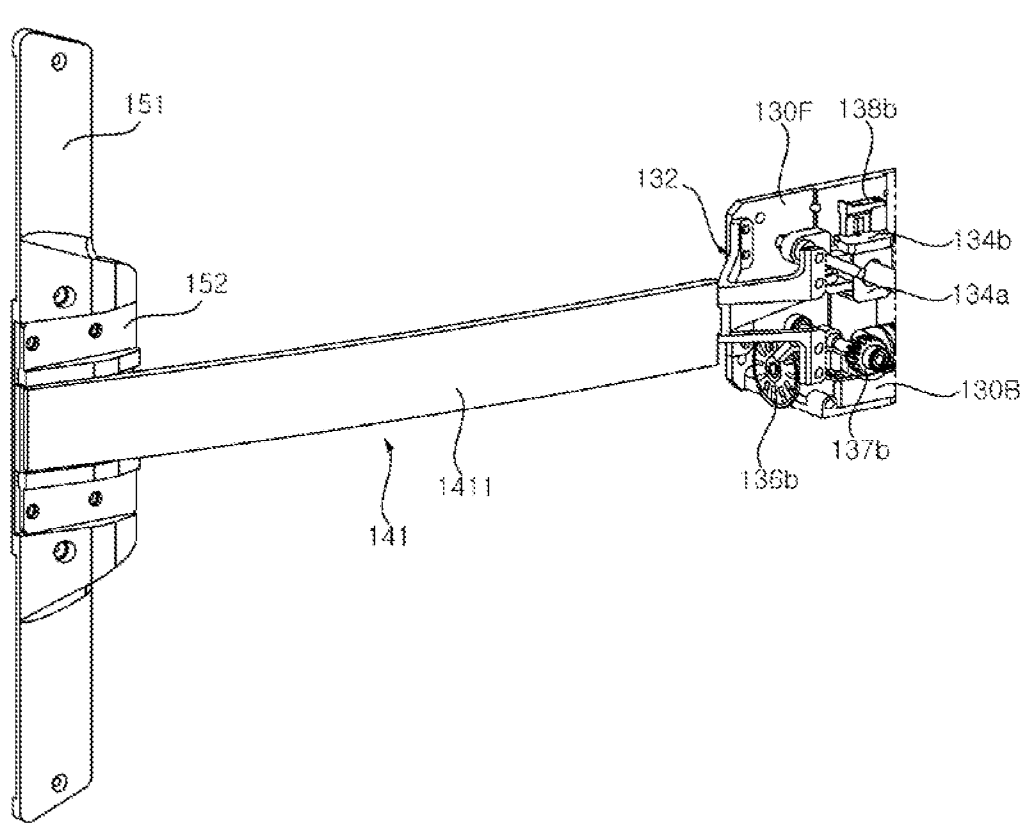
Figure 13:
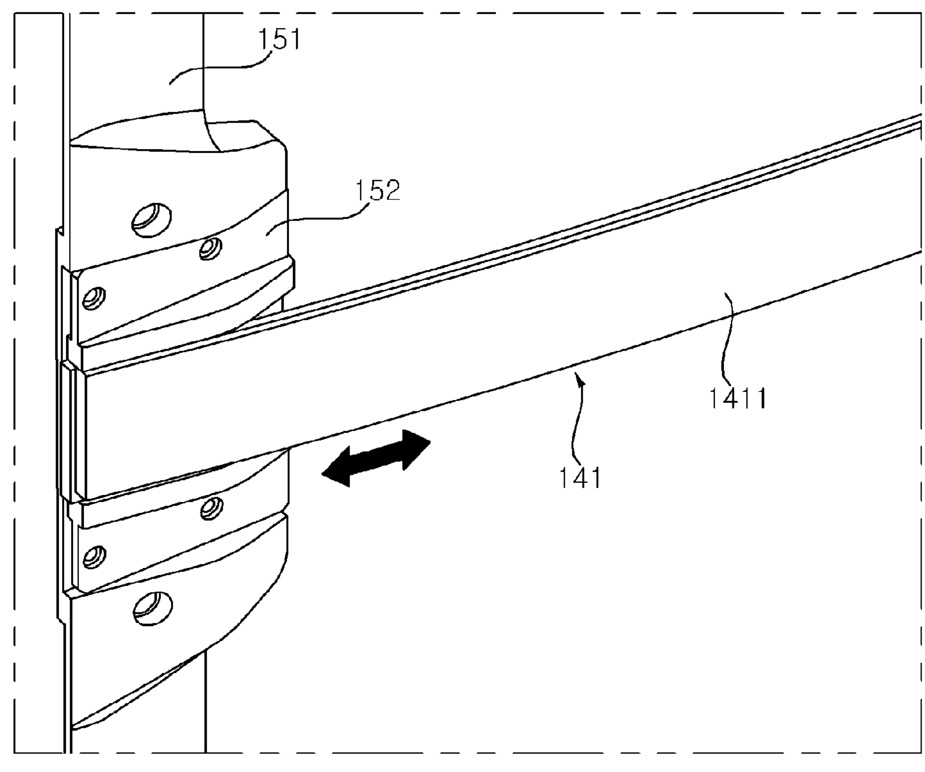
Figure 14:
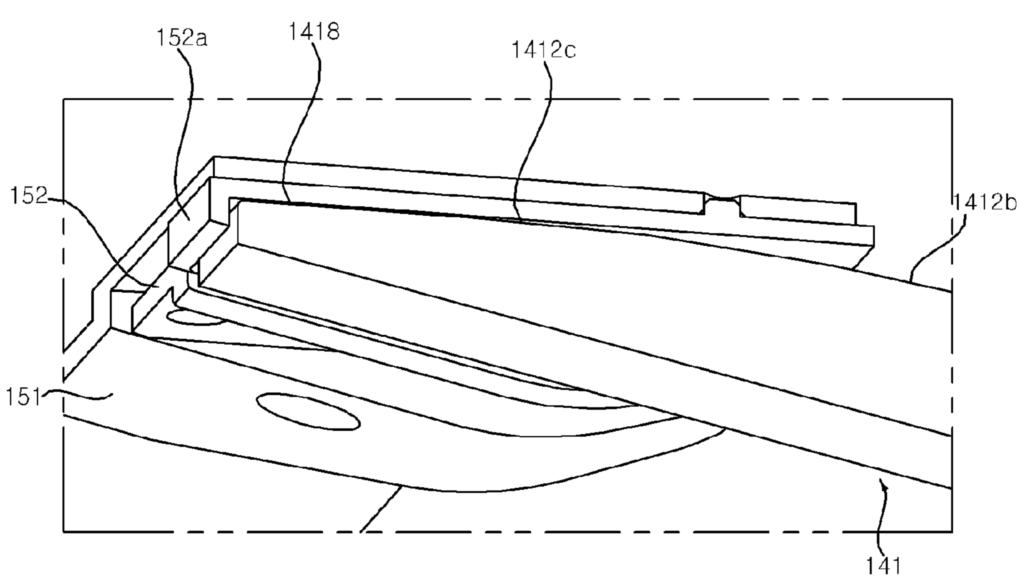

Referring to FIGS. 12 to 14, a side frame 151, 153 (see FIG. 2) may be coupled or fixed to the rear side or rear surface of the plate 120. The side frame 151 may include a sliding mount 152. The sliding mount 152 may be mounted or fixed on the side frame 151.

The wing 141 may be coupled to the sliding mount 152 to be movable on the sliding mount 152. As the wing 141 moves on the sliding mount 152, the third rib 1412*c* and the wing end 1418 may contact the sliding mount 152. As the third rib 1412*c* and the wing end 1418 contact the sliding mount 152 with each other, the force by which the wing 141 bends the plate 120 can be effectively transmitted.

The sliding mount 152 may have a stopper 152*a* formed by bending the distal end. When the plate 120 is maintained to be flat, the wing end 1418 may contact the stopper 152*a* of the sliding mount 152. Accordingly, it is possible to prevent the front surface of the display panel 110 from being convexly curved as both ends of the plate 120 progresses toward the rear side of the display device 100.

Figure 15:
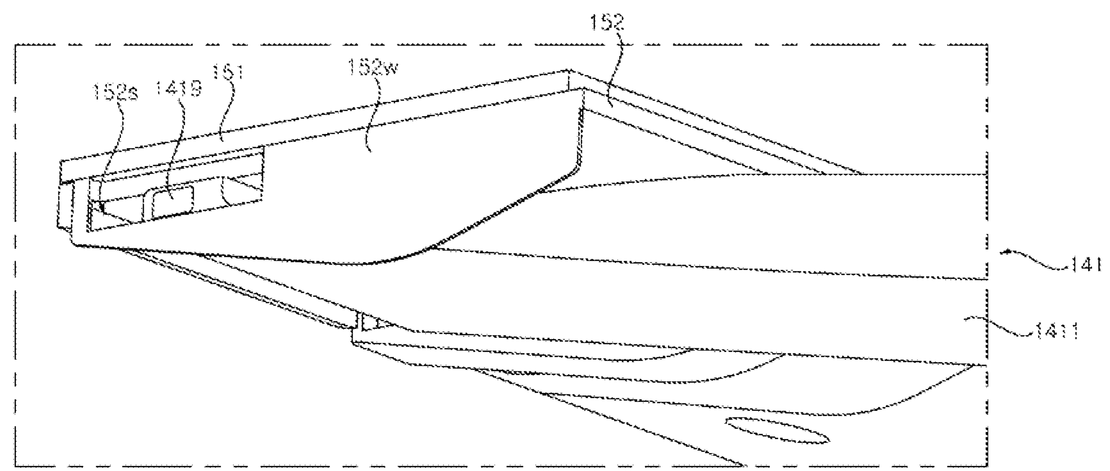
Figure 16:
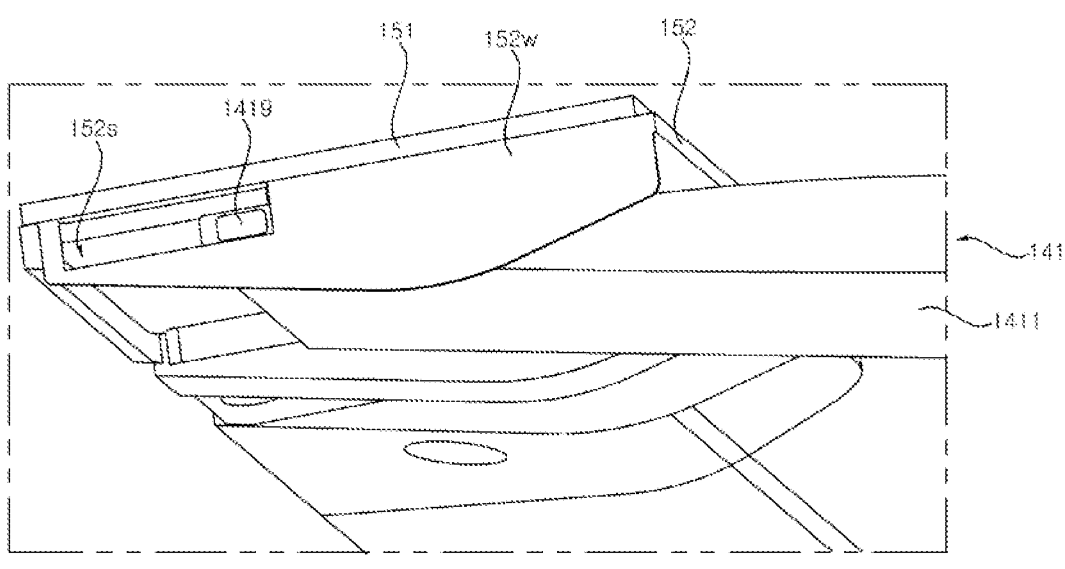

Referring to FIGS. 15 and 16, the sliding mount 152 may include a side wall 152W. The side wall 152W may face a side surface of the wing plate 1411. The wing plate 1411 may come into contact with the side wall 152W while moving on the sliding mount 152. The side wall 152W may guide the movement of the wing plate 1411.

A guide slot 152S may be formed in the sidewall 152W. The guide slot 152S may penetrate the sidewall 152W in the length direction of the wing plate 1411 to be formed long. For example, the guide slot 152S may be rectangular.

The end pin 1419 may be inserted into the guide slot 152S. The end pin 1419 may move in the guide slot 152S. The end pin 1419 may limit the movement of the wing plate 1411 together with the guide slot 152S. For example, the end pin 1419 may have a rectangular cross-section.

Accordingly, the force transmitted by the wing plate 1411 to the side frame 151 may be uniformly maintained. In addition, it is possible to improve the flattening of the area adjacent to both ends of the display panel 110 and the plate 120, as the display panel 110 and the plate 120 are curved.

Referring to FIGS. 1 to 16, the display device includes: a flexible display panel; a flexible plate which is positioned in a rear side of the display panel, and coupled to the display panel; a driving module which is coupled to a rear side of the plate, and has a slider that linearly reciprocates; a wing which extends long, has one end coupled to the slider, has the other end coupled to the rear side of the plate, and has a pivot shaft positioned, between the one end and the other end, to be adjacent to the one end; and a wing bracket which is adjacent to the pivot shaft and fixed to the rear side of the plate, and coupled to the pivot shaft.

The driving module includes: a front bracket fixed to the rear side of the plate; a rear bracket facing the front bracket; and a lead screw which extends long from the front bracket toward the rear bracket, and is rotatably coupled to the front bracket or the rear bracket, wherein the slider is screwed to the lead screw and linearly reciprocates.

The driving module further includes: a first guide shaft which is parallel to the lead screw, and fixed to the front bracket or the rear bracket; and a second guide shaft which is parallel to the lead screw, fixed to the front bracket or the rear bracket, and faces the first guide shaft with respect to the lead screw.

The driving module further includes a slider guide into which the first guide shaft and the second guide shaft are inserted, and which is movable on the first guide shaft and the second guide shaft, and fixed to the slider.

The driving module includes: a motor which is positioned in a lower side of the front bracket and the rear bracket, and has a rotating shaft; a worm fixed to the rotating shaft; a worm gear engaged with the worm; a transmission gear sharing a rotating shaft with the worm gear; and a driving gear which is fixed to the lead screw, and engaged with the transmission gear.

The driving module further includes: a disc indicator fixed to the rotating shaft of the motor; and a sensor which is positioned adjacent to the disk indicator, and detects rotation of the disk indicator.

The driving module further includes: a pin indicator fixed to the slider; and a sensor which is fixed to the front bracket or the rear bracket, and detects approach of the pin indicator.

The wing bracket further includes: an upper bracket positioned in an upper side of the wing; a lower bracket positioned in a lower side of the wing; and a pin which connects the upper bracket and the lower bracket, and is inserted into the pivot shaft of the wing.

The wing includes: a lever extending long from the one end to the pivot shaft; and a wing plate extending long from the other end to the pivot shaft, wherein a width of the wing plate is greater than a width of the lever.

The wing further includes a rib which is positioned between the plate and the wing, extends long from the wing plate to the lever, and is formed on one surface of the lever and the wing plate.

The wing further includes: a wing end which is connected to the wing plate, and forms the other end; and an end pin formed to protrude from one side surface of the wing end.

The display device further includes a sliding mount which is positioned between the plate and the wing end, is fixed to the plate, and is coupled to the wing end, wherein the sliding mount includes: a side wall facing one side surface of the wing end; and a guide slot which is formed to penetrate the sidewall, and into which the end pin is inserted.

The end pin is rectangular, the guide slot is rectangular, and a long side of the guide slot is larger than a long side of the end pin.

The end pin is in contact with the sliding mount.

Any or other embodiments of the present disclosure described above are not mutually exclusive or distinct. Any or other embodiments of the present disclosure described above may be used jointly or combined in each configuration or function.

For example, it means that configuration A described in a specific embodiment and/or drawings may be combined with configuration B described in other embodiments and/or drawings. That is, even if the coupling between the components is not directly described, it means that the coupling is possible except for the case where it is described that the coupling is impossible.

The above detailed description should not be construed as restrictive in all respects and should be considered as illustrative. The scope of the present disclosure should be determined by a reasonable interpretation of the appended claims, and all modifications within the equivalent scope of the present disclosure are included in the scope of the present disclosure.

The invention claimed is:

1. A display device comprising:
- a flexible display panel;
- a flexible plate at a rear of the display panel, and coupled to the display panel;
- a driving module coupled to a rear side of the flexible plate, and including a slider linearly moving;
- a wing extending long, and including one end coupled to the slider and the other end coupled to the rear side of the flexible plate, the wing including a pivot shaft between the one end and the other end adjacent to the one end; and
- a wing bracket fixed to the rear side of the flexible plate and coupled to the pivot shaft,
- wherein the slider moves in a thickness direction of the display panel.

2. The display device of claim 1, wherein the driving module comprises:
- a front bracket fixed to the rear side of the flexible plate;
- a rear bracket facing the front bracket; and
- a lead screw extending long from the front bracket toward the rear bracket, rotatably coupled to the front bracket or the rear bracket, and aligned parallel with the thickness direction of the display panel,
- wherein the slider linearly moving according to a rotation of the lead screw.

3. The display device of claim 2, wherein the driving module further comprises:

a first guide shaft in parallel with the lead screw, the first guide shaft fixed to the front bracket or the rear bracket; and a second guide shaft in parallel with the lead screw, the second guide shaft fixed to the front bracket or the rear bracket and being opposite to the first guide shaft with respect to the lead screw.

4. The display device of claim 3, wherein the driving module further comprises a slider guide into which the first guide shaft and the second guide shaft are inserted, and which is movable on the first guide shaft and the second guide shaft and fixed to the slider.

5. The display device of claim 2, wherein the driving module comprises:

a motor positioned at a lower side of the front bracket and the rear bracket and including a rotating shaft;

a worm fixed to the rotating shaft;

a worm gear engaged with the worm;

a transmission gear fixed to a rotating shaft with the worm gear; and a driving gear fixed to the lead screw and engaged with the transmission gear.

6. The display device of claim 5, wherein the driving module further comprises:

a disk indicator fixed to the rotating shaft of the motor; and a sensor positioned adjacent to the disk indicator and detecting a rotation of the disk indicator.

7. The display device of claim 2, wherein the driving module further comprises:

a pin indicator fixed on the slider; and a sensor fixed to the front bracket or the rear bracket and detecting the pin indicator.

8. The display device of claim 2, wherein the wing bracket further comprises:

an upper bracket positioned at an upper side of the wing;

a lower bracket positioned at a lower side of the wing; and a pin connecting with the upper bracket and the lower bracket and inserted into the pivot shaft of the wing.

9. The display device of claim 1, wherein the wing comprises:

a lever extending long between the one end and the pivot shaft; and a wing plate extending long between the other end and the pivot shaft, wherein a width of the wing plate is greater than a width of the lever.

10. The display device of claim 9, wherein the wing further comprises a rib which is positioned between the flexible plate and the wing, extends long from the wing plate to the lever, and is formed on a surface of the lever and the wing plate.

11. The display device of claim 10, wherein the wing further comprises:

a wing end which is connected to the wing plate, and forms the other end of the wing; and an end pin formed to protrude from one side surface of the wing end.

12. The display device of claim 11, further comprising a sliding mount positioned between the flexible plate and the wing end, fixed to the flexible plate, and coupled to the wing end, wherein the sliding mount comprises:

a sidewall facing the one side surface of the wing end; and a guide slot which is formed to penetrate the sidewall, and into which the end pin is inserted.

13. The display device of claim 11, wherein the end pin is rectangular, the guide slot is rectangular, and a long side of the guide slot is larger than a long side of the end pin.

14. The display device of claim 13, wherein the end pin is in contact with the sliding mount.

* * * * *